United States Patent [19]

Hileman et al.

[11] Patent Number: 5,734,551
[45] Date of Patent: Mar. 31, 1998

[54] METHOD TO INSTALL SIMMS WITHOUT CAUSING DISCOMFORT TO THE USER

[75] Inventors: Vince Hileman; Kenneth Kitlas, both of San Jose, Calif.

[73] Assignee: Sun Microsystems, Inc., Mountain View, Calif.

[21] Appl. No.: 556,732

[22] Filed: Nov. 7, 1995

[51] Int. Cl.$^6$ ................................................ H05K 7/20
[52] U.S. Cl. ........................... 361/695; 361/801; 361/802
[58] Field of Search ..................................... 361/610, 687, 361/694–695, 725, 726, 732, 754, 755, 759, 797, 798, 801, 802, 829; 439/61, 325, 327, 368, 442, 448

[56] References Cited

U.S. PATENT DOCUMENTS

| | | | |
|---|---|---|---|
| 3,848,953 | 11/1974 | Petroshanoft | 439/327 |
| 4,124,878 | 11/1978 | Ebner | 439/368 |
| 4,862,400 | 8/1989 | Selbrede | 439/61 |
| 5,214,572 | 5/1993 | Cosimano et al. | 361/690 |

OTHER PUBLICATIONS

Adams et al, "Circuit Card Cover and Bracket–Hinge", IBM Tech Disl. Bulletin, vol. 10, No. 4, Sep. 1967. pp. 482–483.

*Primary Examiner*—Gregory D. Thompson
*Attorney, Agent, or Firm*—Blakely Sokoloff Taylor & Zafman

[57] ABSTRACT

A computer chassis cover that pushes an electronic card into a motherboard. The cover is pivotally connected to the chassis and can be rotated between an open position and a closed position. The cover encloses an electronic card that is plugged into a motherboard. When in the closed position, the inner surface of the cover is separated from the motherboard by a distance that is approximately equal to the distance between the motherboard and a top edge of the electronic card. When the cover is in the closed position the card is pushed into a fully mated position when the card is in a fully mated position. If the electronic card is higher than the fully mated position, the cover will engage and push the card into the motherboard. To install an electronic card, the card is initially partially plugged into a connector mounted to the motherboard. The cover is then rotated into the closed position to engage and push the electronic card further into the motherboard connector to the fully mated position. The cover has wide handle area that widely distributes the insertion force of the card. The distributed force reduces the end user discomfort when pushing the card into the motherboard.

6 Claims, 2 Drawing Sheets

METHOD TO INSTALL SIMMS WITHOUT CAUSING DISCOMFORT TO THE USER

BACKGROUND OF THE INVENTION

1. Field of the Invention

The present invention relates to a computer chassis.

2. Description of Related Art

The electrical components of a computer are typically located within a housing that has a cover which is attached to a chassis. Within the housing are a plurality of electronic cards that are plugged into a motherboard located at the base of the chassis. The cards are typically plugged into designated chassis slots of the computer housing.

Computer housings are typically shipped and sold with the necessary memory, microprocessor, etc. devices required to operate a computer. Most computer vendors provide a number of empty slots which allow the end user to upgrade the system. For example, many commercially available computers have a number of additional slots that allow the end user to add additional memory to the system.

There have been developed memory cards commonly referred to as single in-line memory modules (SIMMs). SIMMs typically contain a number of memory devices mounted to a rectangular shaped printed circuit board. Along one edge of the printed circuit board are a plurality of contact pads that can be inserted into an electrical connector. The connectors typically require a threshold insertion force from the end user to push the contact pads into the slot of the connector. SIMM cards have historically been plugged into the motherboard by pressing down on the top edge of the printed circuit board. The edge of the printed circuit board is relatively thin and can cause discomfort to the end user when pushing the card into the connector.

There have been developed tools that install electronic cards into a connector. These tools are not always available to the end user. The tools also increase the cost of the system and the complexity of adding the cards to the computer. It would be desirable to provide a computer chassis that would plug an electronic card into a motherboard without causing discomfort to the end user.

SUMMARY OF THE INVENTION

The present invention is a computer chassis cover that pushes an electronic card into a motherboard. The cover is pivotally connected to the chassis and can be rotated between an open position and a closed position. The cover encloses an electronic card that is plugged into a motherboard. When in the closed position, the inner surface of the cover is separated from the motherboard by a distance that is approximately equal to the distance between the motherboard and a top edge of an electronic card in a fully mated position. If the electronic card is higher than the fully mated position, the cover will engage and push the card into the motherboard. To install an electronic card, the card is initially partially plugged into a connector mounted to the motherboard. The cover is then rotated into the closed position to engage and push the electronic card further into the motherboard connector. The cover has a wide handle area that distributes the insertion force of the card. The distributed force reduces the end user discomfort when pushing the card into the motherboard.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
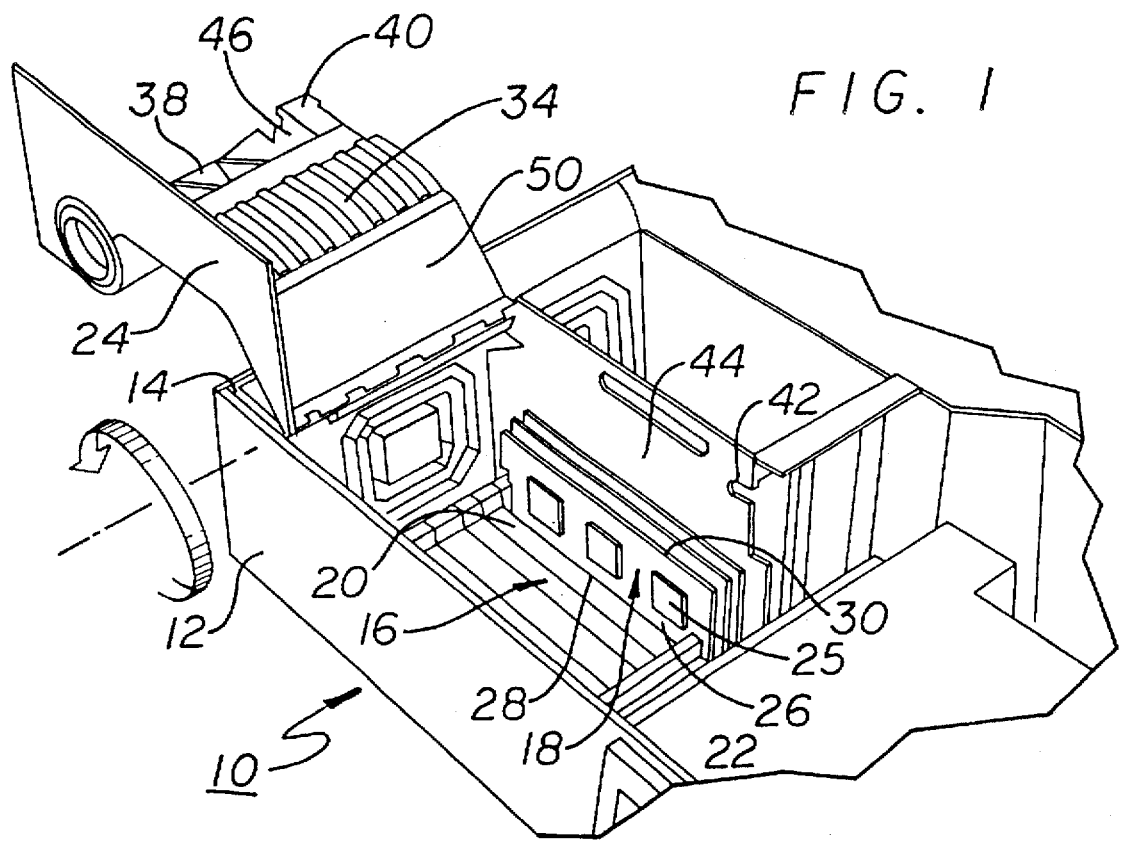
FIG. 1 is a perspective view showing a cover for a computer chassis subassembly.

Referring to the drawings more particularly by reference numbers, FIG. 1 shows an electronic assembly 10 of the present invention. The assembly 10 is part of a computer which has a chassis 12 that contains a number of electronic components. The chassis 12 is typically constructed from a metal frame that is enclosed by an outer housing cover (not shown) that covers the entire computer.

In the preferred embodiment, the chassis 12 contains a subassembly 14 that defines a compartment 16. The compartment 16 contains a plurality of electronic cards 18 that are plugged into connectors 20. The connectors 20 are mounted to a motherboard 22 located at the base of the chassis 12. The subassembly 14 has a cover 24 that can be rotated between an open position and a closed position. When rotated into the closed position the cover 24 engages and pushes the electronic cards 18 into the connectors 20. Although the cover 24 is shown and described as pivotally connected to a chassis subassembly 14, it is to be understood that the cover 24 can be pivotally connected to the chassis 12.

The electronic cards 18 are preferably single in-line memory modules (SIMMs) which have a plurality of electronic devices 25 mounted to a printed circuit board 26. The printed circuit board 26 has a connector edge 28 and an opposite top edge 30. The connector edge 28 has a plurality of plated contacts that are inserted into a motherboard connector 20. The SIMM cards 18 can be coupled to the motherboard 22 by pushing the connector edge 28 of the printed circuit board 26 into a connector 20. The attachment and detachability of the cards 18 allow an end user to readily add, replace and subtract memory from the computer.

Figure 2:
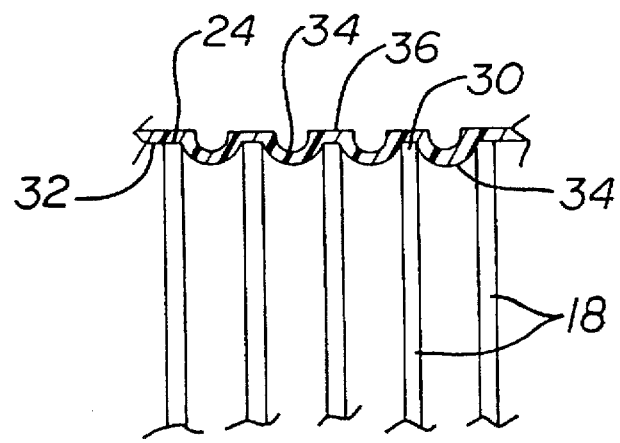
FIG. 2 is a front sectional view showing a plurality of electronic cards within corresponding grooves of the cover.

As shown in FIG. 2, the bottom surface 32 of the cover 24 has a plurality of ridges 34 that are separated by a plurality of grooves 36. The top edges 30 of the cards 18 fit within the grooves 36 and are restrained by the ridges 34 when the cover 24 is in the closed position. The ridges 34 prevent the cards 18 from rattling about the chassis 12 when the computer is shipped from the assembly site. The cover 24 is typically constructed from a molded plastic material that contains the integrally molded ridges 34.

Referring to FIG. 1, the cover 24 has a relatively wide handle area 38 that allows the end user to grab and rotate the cover 24 to the closed position. The wide handle area 38 distributes the insertion force required to insert the cards 18 into the connectors 20 and reduces the amount of discomfort to the fingers and hand of the end user.

The cover 24 may have a latch 40 that engages a slot 42 in a wall 44 of the subassembly 14. When engaged with the slot 42 that latch 40 secures the cover 24 in the closed position. The latch 40 may have a button 46 that can be depressed by the end user to disengage the latch 40 and rotate the cover 24 to the open position.

Figure 3:
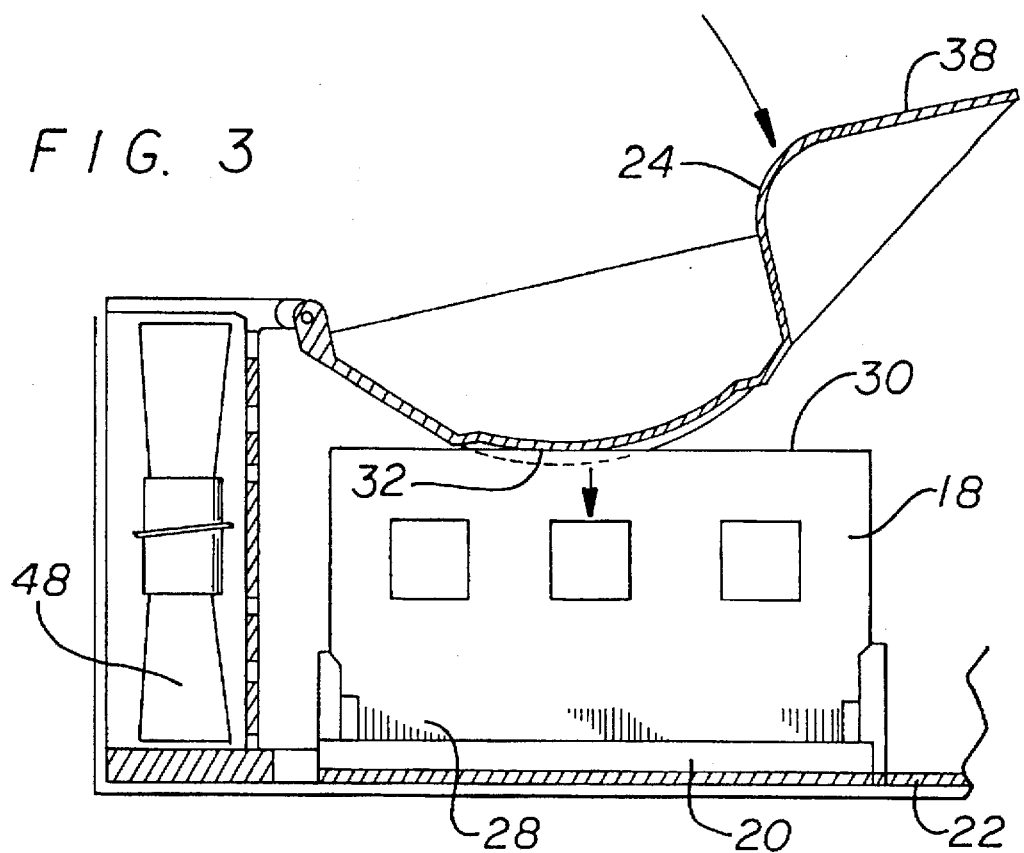
FIG. 3 is a side sectional view showing the cover pushing an electronic card into a motherboard connector.

As shown in FIG. 3, to install an electronic card 18, the card 18 is initially inserted into a connector 20. The connector edge 28 is only partially inserted into the connector 20. The insertion force required to initially insert the card 18 into the connector 20 is relatively small compared to the force required to push the card fully into the connector 20.

The cover 24 is then rotated to the closed position. The rotated cover 24 engages and pushes the card 18 further into the connector 20 into a fully mated position. The distance between the bottom surface 32 of the cover 24 and the motherboard 20 is approximately equal to the distance between the motherboard 20 and the top edge 30 of the electronic card 18, when the card 18 is in the fully mated position. Thus when the cover 24 is closed and secured by the latch 40, the bottom surface 32 pushes the card 12 into the fully mated position.

Figure 4:
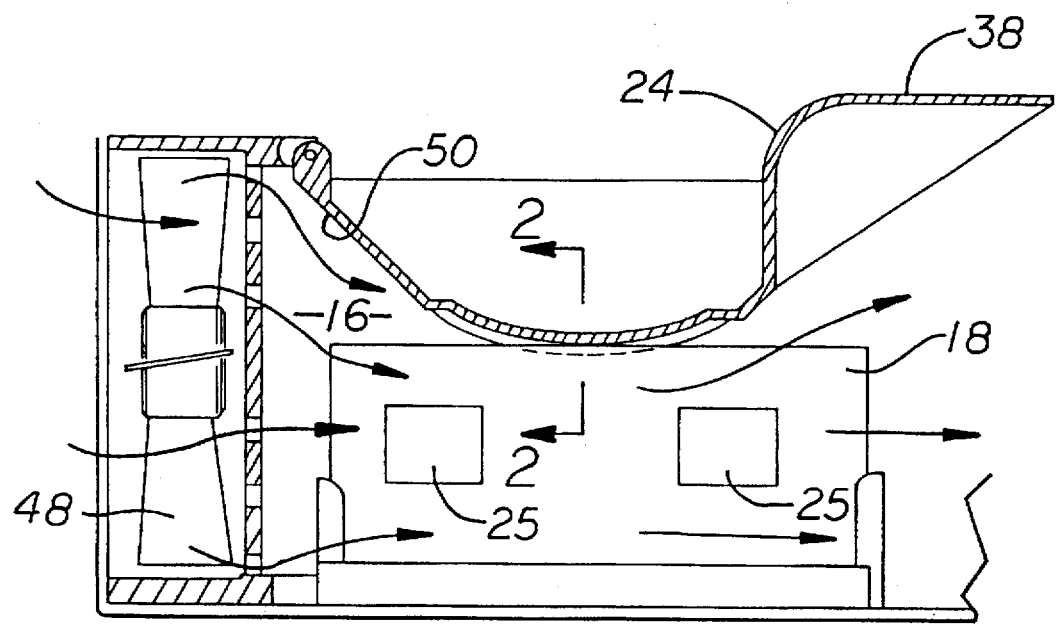
FIG. 4 is a side sectional view similar to FIG. 2 showing a fan blowing air across the electronic card.

As shown in FIG. 4, the subassembly 16 may have a fan 48 that creates a flow of air through the compartment 16. The air flows across the card 18 and removes heat generated by the electronic devices 25. The cover 24 preferably has an outwardly tapering wall 50 that guides the air directly across the card 18. By directing all of the air across the surface of the card, the wall 50 increases the heat transfer rate between the air and the devices 25.

The present invention thus provides a cover 24 which can enclose electronic cards within a computer chassis, push the cards into motherboard connectors, restrain the cards within the chassis and duct cooling air directly onto the electronic packages of the cards. The cover 24 may also provide further structural support for an item, such as a monitor, that is placed on top of the computer housing.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic assembly, comprising:

a chassis;

a motherboard located within said chassis;

a plurality of electronic cards coupled to said motherboard, each electronic card having an edge;

a cover that is pivotally connected to said chassis and having a plurality of ridges that are separated by a plurality of grooves, said cover rotates into a closed position such that the edge of each electronic card is received by a corresponding groove of said cover.

2. The cover as recited in claim 1, wherein said cover has an outwardly tapering wall.

3. The cover as recited in claim 1, wherein said cover has a latch that engages the chassis to secure said cover in the closed position.

4. An electronic assembly, comprising:

a chassis;

a motherboard located within said chassis;

an electronic card coupled to said motherboard; and, a cover that is pivotally connected to said chassis, said cover rotates between an open position and a closed position, said cover engages and pushes said electronic card into said motherboard when said cover is rotated from the open position to the closed position, said cover having an outwardly tapering wall; and a fan that creates an air flow, wherein said outwardly tapering wall guides the air flow directly across said electronic card.

5. The assembly as recited in claim 4, wherein said cover has a pair of ridges that are separated by a groove that receives an edge of said electronic card.

6. The assembly as recited in claim 4, wherein said cover has a latch that engages said chassis to secure said cover in the closed position.

* * * * *